(12) United States Patent
Scheffer et al.

(10) Patent No.: US 7,151,287 B1
(45) Date of Patent: Dec. 19, 2006

(54) MINIMIZING THE EFFECT OF DIRECTLY CONVERTED X-RAYS IN X-RAY IMAGERS

(75) Inventors: Danny Scheffer, Clinge (NL); Tom A. Walschap, Bomem (BE)

(73) Assignee: Cypress Semiconductor Corporation, San Jose, CA (US)

( * ) Notice: Subject to any disclaimer, the term of this patent is extended or adjusted under 35 U.S.C. 154(b) by 22 days.

(21) Appl. No.: 11/089,737

(22) Filed: Mar. 25, 2005

(51) Int. Cl.
   *H01L 31/062* (2006.01)
(52) U.S. Cl. ............... 257/292; 257/291; 257/E31.054
(58) Field of Classification Search ............... 257/291, 257/292
   See application file for complete search history.

(56) References Cited

U.S. PATENT DOCUMENTS 6,545,303 B1  4/2003  Scheffer
6,608,337 B1*  8/2003  Hynecek ................. 257/290
6,683,360 B1  1/2004  Dierickx
6,686,220 B1*  2/2004  Rhodes et al. ............ 438/69
6,690,074 B1  2/2004  Dierickx
6,815,791 B1* 11/2004  Dierickx ................. 257/461
6,838,714 B1*  1/2005  Rhodes et al. ............ 257/233

* cited by examiner

*Primary Examiner*—Roy Potter
(74) *Attorney, Agent, or Firm*—Okamoto & Benedicto LLP

(57) ABSTRACT

In one embodiment, an image sensor for an x-ray imager includes a photodiode and a readout circuit. A deep well formed below the readout circuit may be configured as a diode to drain away parasitic electrons, which would otherwise induce noise in images. The parasitic electrons may be drained away to a power supply or a measuring circuit for dosimetric purposes, for example.

15 Claims, 7 Drawing Sheets

MINIMIZING THE EFFECT OF DIRECTLY CONVERTED X-RAYS IN X-RAY IMAGERS

BACKGROUND OF THE INVENTION

1. Field of the Invention

The present invention relates generally to image sensors, and more particularly but not exclusively to those used in x-ray imagers.

2. Description of the Background Art

An x-ray imager may comprise a CMOS (Complementary Metal Oxide Semiconductor) image sensor and a scintillator. The scintillator converts x-rays to visible light, which impinges a photodiode in the image sensor. The image sensor also includes a readout circuit for reading a pixel of image information from the photodiode. A typical image sensor has several photodiodes and readout circuits to generate an entire image. The image may be displayed on a monitor or printed for viewing purposes.

Readout circuits are typically formed on the same substrate as the photodiodes, and thus limit the useful (i.e., light sensitive) area of the photodiodes. Because readout circuits are not designed to convert light to image information, a metal shield may be formed over the readout electronics to make it insensitive to incoming light. Preferably, incoming light generates free electrons only in regions surrounding the photodiode. In contrast to light, x-rays hitting the image sensor may generate large clouds of free electrons everywhere, even underneath the metal shield. This direct conversion of x-rays, which occurs in silicon portions of the image sensor, result in parasitic electrons that may introduce noise in images.

SUMMARY

In one embodiment, an image sensor for an x-ray imager includes a photodiode and a readout circuit. A deep well formed below the readout circuit may be configured as a diode to drain away parasitic electrons, which would otherwise induce noise in images. The parasitic electrons may be drained away to a power supply or a measuring circuit for dosimetrie purposes, for example.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided, such as examples of structures, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
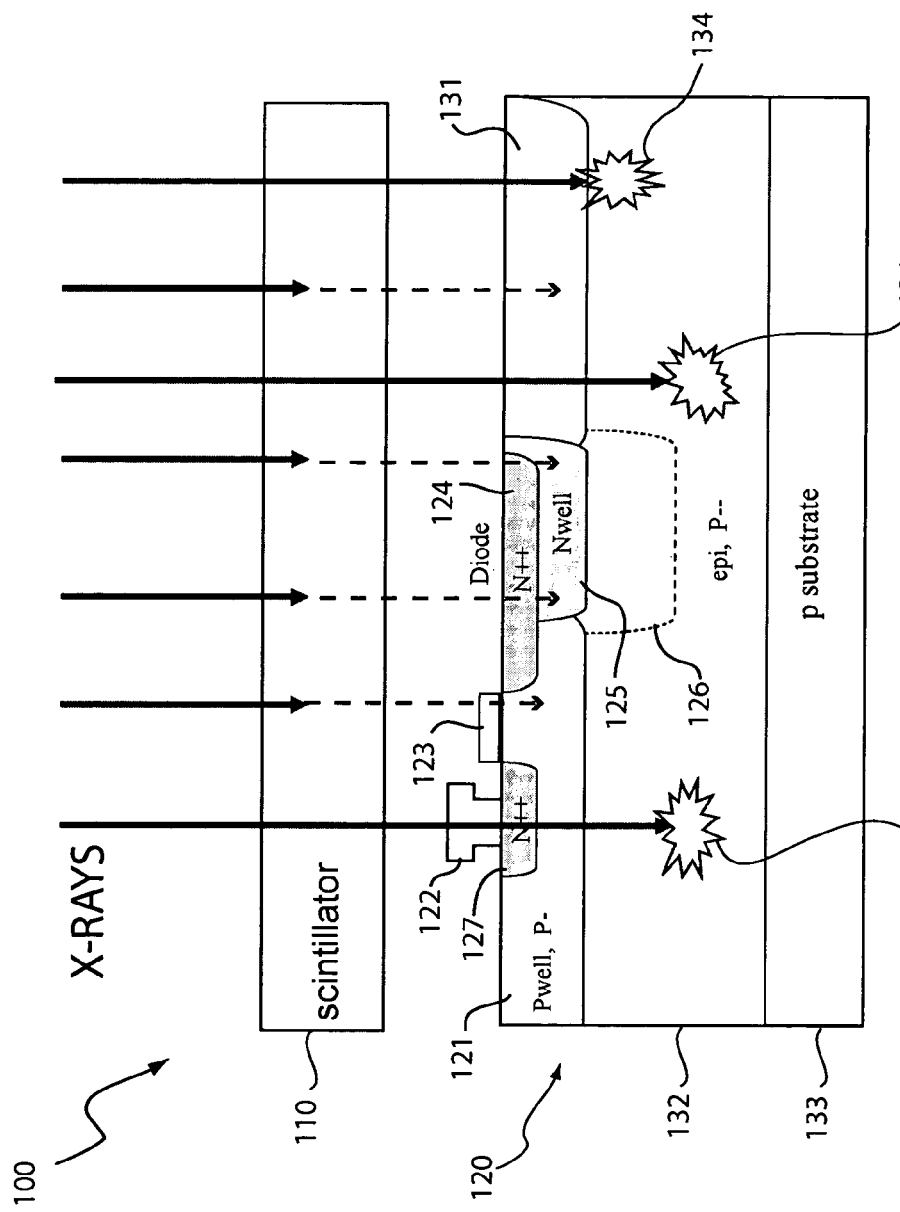
FIG. 1 schematically shows an example x-ray imager.

FIG. 1 schematically shows an example x-ray imager 100. X-ray imager 100 includes a scintillator 110 and a CMOS image sensor 120. Scintillator 110 converts incoming x-rays into visible light. In the example of FIG. 1 and other figures in the present disclosure, x-rays are depicted as solid arrow lines and visible light is depicted as dashed arrow lines.

The image sensor 120 includes a p-type silicon substrate 133 and an epitaxial layer 132. A P-well 121, a P-well 131, and an N-well 125 are formed in the epitaxial layer 132. A photodiode comprising an N++ region 124 is formed in the N-well 125, while a readout circuit that includes an N++ region 127 is formed in the P-well 121. The electron collection region or depletion region of the photodiode is generally bounded by a dashed boundary line 126.

Still referring to FIG. 1, x-rays passing through the scintillator 110 are converted to visible light. Light hitting the collection region of the photodiode generates electrons, which may be read out through the readout circuit by enabling a gate 123. A metal contact 122 is coupled to the N++ region 127 to allow generated electrons to flow out of the readout circuit for further processing. One problem with the imager 100 is that some x-rays not converted by the scintillator 100 to visible light generate parasitic electron clouds 134 upon hitting the epitaxial layer 132. The conversion of x-rays to free electrons in a CMOS image sensor is also referred to as "direct conversion." Direct conversion may occur even under metal shields overlying readout circuits, and thus can possibly be read out of the readout circuit. Parasitic electrons from directly converted x-rays, in general, result in image noise because they do not contain image information.

One way of minimizing the effects of directly converted x-rays is to reduce the thickness of the epitaxial layer 132. For example, epitaxial layer 132 may be formed to a thickness of about 2 microns. One drawback to this approach is the reduced sensitivity for light having wavelengths with a typical penetration depth beyond this epitaxial layer thickness. Other ways of minimizing the effects of directly converted x-rays in an image sensor are now discussed beginning with FIG. 2.

Figure 2:
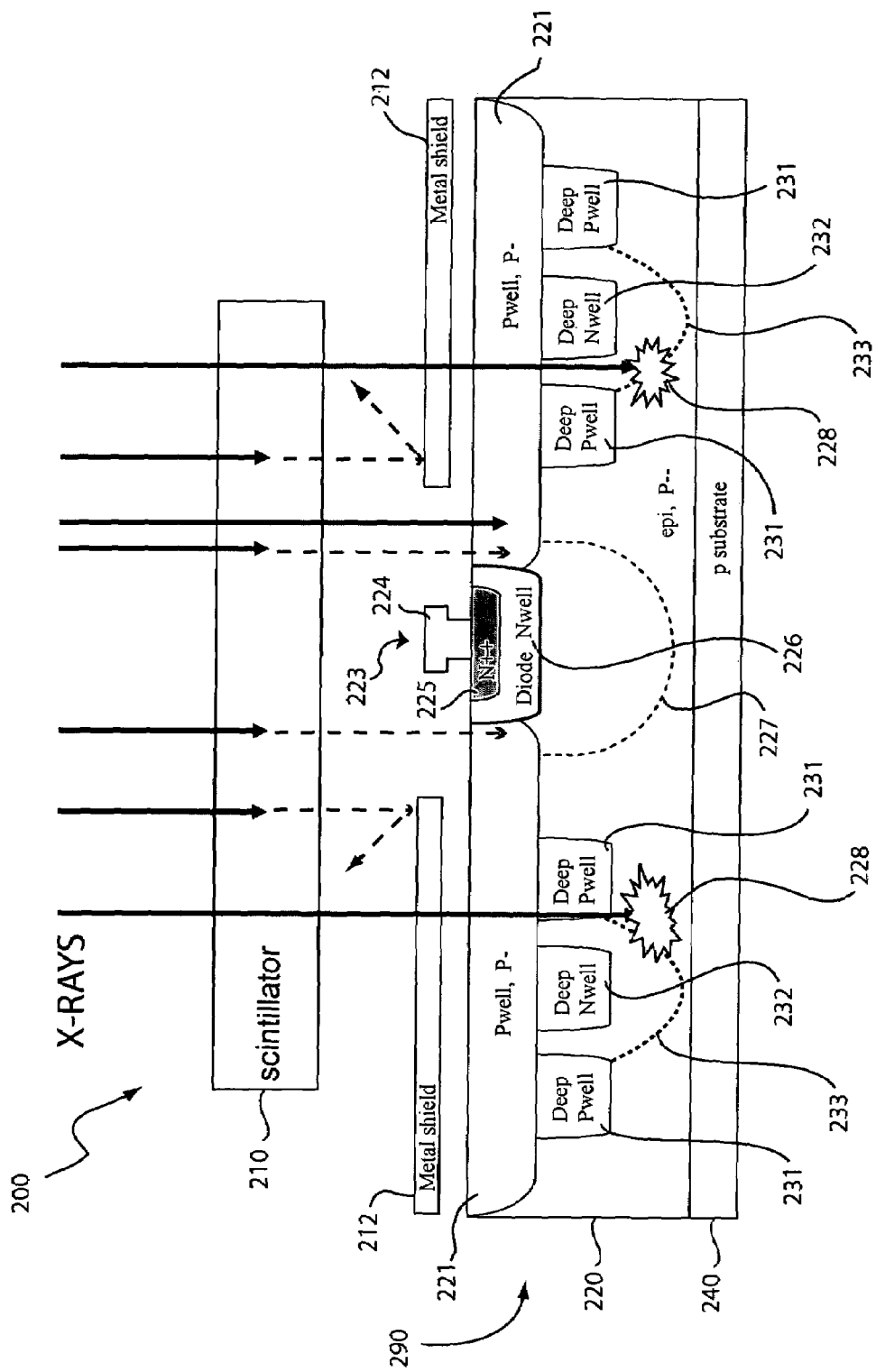
FIG. 2 schematically shows an x-ray imager in accordance with an embodiment of the present invention.

FIG. 2 schematically shows an x-ray imager 200 in accordance with an embodiment of the present invention. In the example of FIG. 2, imager 200 includes a scintillator 210 and a CMOS image sensor 290. The scintillator 210 converts x-rays to visible light. In one embodiment, the scintillator 210 converts x-rays to green light (i.e., approximately 550 nm wavelength). In FIG. 2, x-rays are depicted as solid arrow lines and visible light is depicted as dashed arrow lines.

The CMOS image sensor 290 may comprise a substrate 240, an epitaxial layer 220, and metal shields 212. Image sensor 290 may comprise a plurality of photodiodes 223 and readout circuits, which are not shown in the interest of clarity. A readout circuits may be formed in a P-well 221. Each photodiode and corresponding readout circuit form a "pixel" of the image sensor 290. Several pixels are employed to form an entire image. A dielectric layer (not shown), such as an oxide layer, is formed between the metal shields 212 and the epitaxial layer 220. The oxide layer (i.e., silicon dioxide) is transparent to light and may thus be formed across the entire top surface of the image sensor 290. The metal shields 212 may be part of the metal routing of a readout circuit that is formed in a P-well 221. For example, the metal shields 212 may be connected to a power supply (e.g., Vdd), control signals, output signals, and the like. Metal routings of readout circuits are preferably centered between photodiodes 224 of two adjacent pixels of the image sensor 290 to avoid covering light sensitive parts (e.g., photodiode 223) and to create a zone in which there are no electrons generated. This improves optical crosstalk.

In one embodiment, the substrate 240 comprises a p-type silicon substrate. The epitaxial layer 220 may be lightly doped (P— in this example) and epitaxially grown on top of the substrate 240. In one embodiment, the epitaxial layer 220 is about 4 to 5 microns thick. A photodiode 223 comprising an N++ region 225 may be formed in an N-well 226. Only one photodiode 223 is shown in FIG. 2 for clarity of illustration. In the example of FIG. 2, the electron collection area of a photodiode 223 is generally bounded by dashed boundary line 227. A photodiode 223 collects the electrons generated by visible light hitting silicon, such as the epitaxial layer 220. It is to be noted that, generally speaking, free electrons are either collected by a junction (transistor or photodiode) or recombine somewhere in the epitaxial layer. As the diffusion length is normally quite long, e.g., greater than about 10 microns, it is more likely for electrons to be first collected by a junction. A metal contact 224 is coupled to the N++ region 225 to allow generated electrons in a photodiode 223 to be flown out to a readout circuit, which as mentioned may be in a P-well 221.

To minimize the effects of directly converted x-rays, deep N-wells 232 may be formed such that they extend below P-wells 221. Deep P-wells 231 extending below P-wells 221 may also be formed to prevent lateral cross talk by limiting the width of the depletion region of a deep N-well 232. That is, deep P-wells 231 may be formed to prevent electrons from laterally moving beyond them. A deep trench filled with isolation material (e.g., oxide) may also be used instead of a deep P-well 231 to avoid lateral crosstalk. In the example of FIG. 2, the depletion region of a deep N-well 232 is depicted by a dashed boundary line 233. Preferably, a deep N-well 232 is formed to a depth that would allow its depletion region to at least touch the substrate 240. For example, a deep N-well 232 may be formed to a depth of about 1 to 2 microns from the top of the epitaxial layer 220, while a P-well 221 and an N-well 125 may be formed to a depth of about 1 to 2 microns from the top of the epitaxial layer 220. To provide an efficient barrier against electrons generated within a deep N-well 232's collection area, a deep P-well 231 is preferably formed such that it at least touches the substrate 240. Note that the deep P-wells 231 and deep N-wells 232 are not drawn to touch the substrate 240 to avoid cluttering FIG. 2. Of course, the depth of deep P-wells 231 and deep N-wells 232 do not necessarily touch the substrate 240 depending on implementation.

Figure 3:
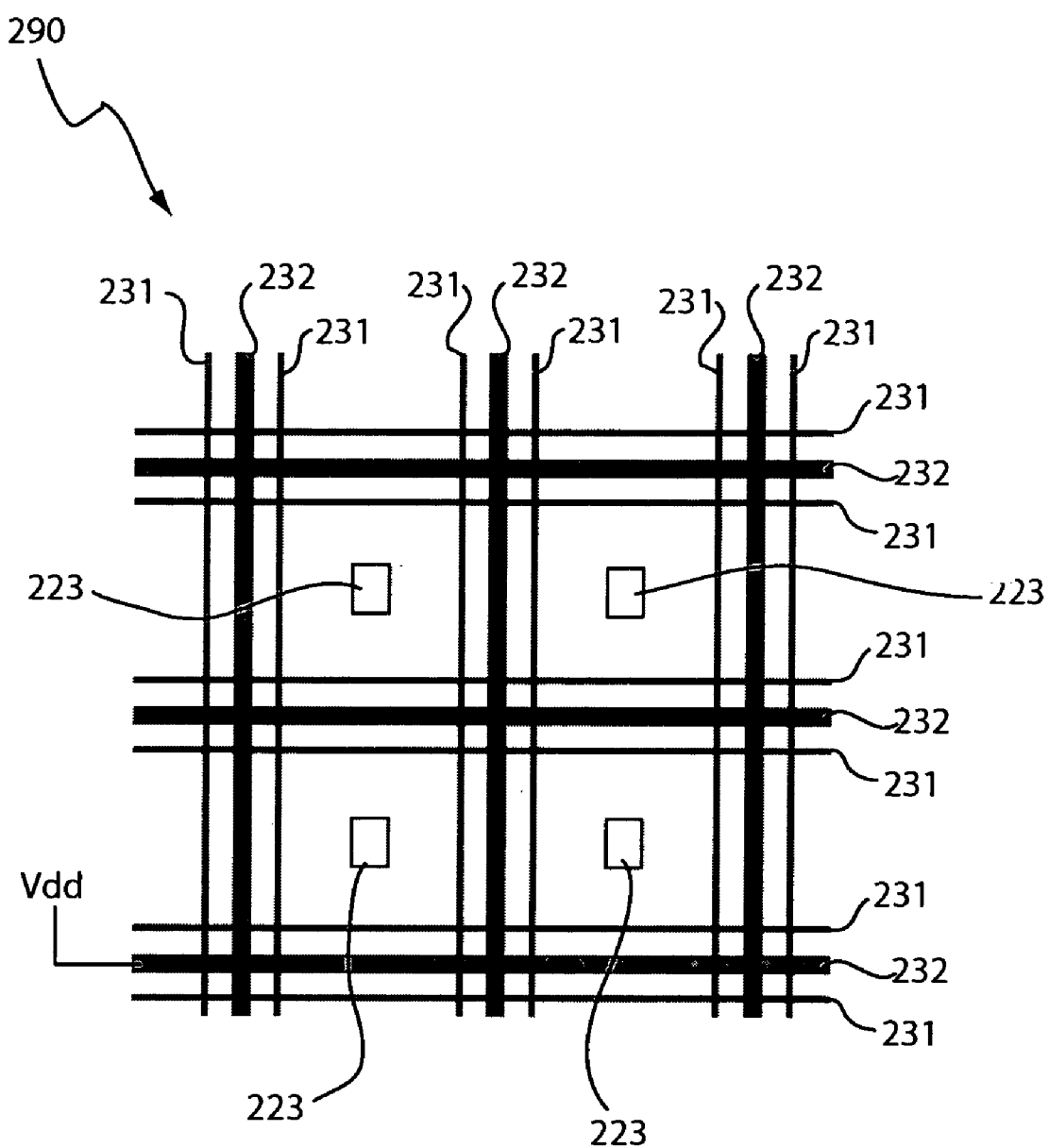
FIG. 3 schematically shows a layout view of a CMOS image sensor in accordance with an embodiment of the present invention.

The layout of photodiodes 223, deep N-wells 232, and deep P-wells 231 is schematically illustrated in the top view of FIG. 3. As shown in FIG. 3, photodiodes 223 are preferably placed equidistant from surrounding deep N-wells 232 to prevent asymmetries that may result in individual pixels responding differently. A deep N-well 232 may be connected to a power supply (Vdd in the example of FIG. 3) to drain away electrons generated by directly converted x-rays. Alternatively, a deep N-well 232 may be connected to a measuring circuit (not shown) for dosimetrie purposes. For example, parasitic electrons drained away by a deep N-well 232 may be used as a feedback signal to adjust the power of the x-ray source.

Referring back to FIG. 2, x-rays not converted by scintillator 210 to visible light may hit regions of the epitaxial layer 220 under the metal shields 212. These x-rays may be directly converted to parasitic electrons, forming electron clouds 228. Instead of being readout as part of an image signal from a readout circuit formed in a P-well 221, the parasitic electrons are drained away from the readout circuit by way of the diode formed by a deep N-well 232 and the epitaxial layer 220. This advantageously minimizes noise in images due to directly converted x-rays, assuming that all free electrons underneath the metal shield are generated by XRAYs and not by visible light coming from the scintillator As mentioned, parasitic electrons may be drained to a power supply or used for dosimetrie purposes.

Figure 4:
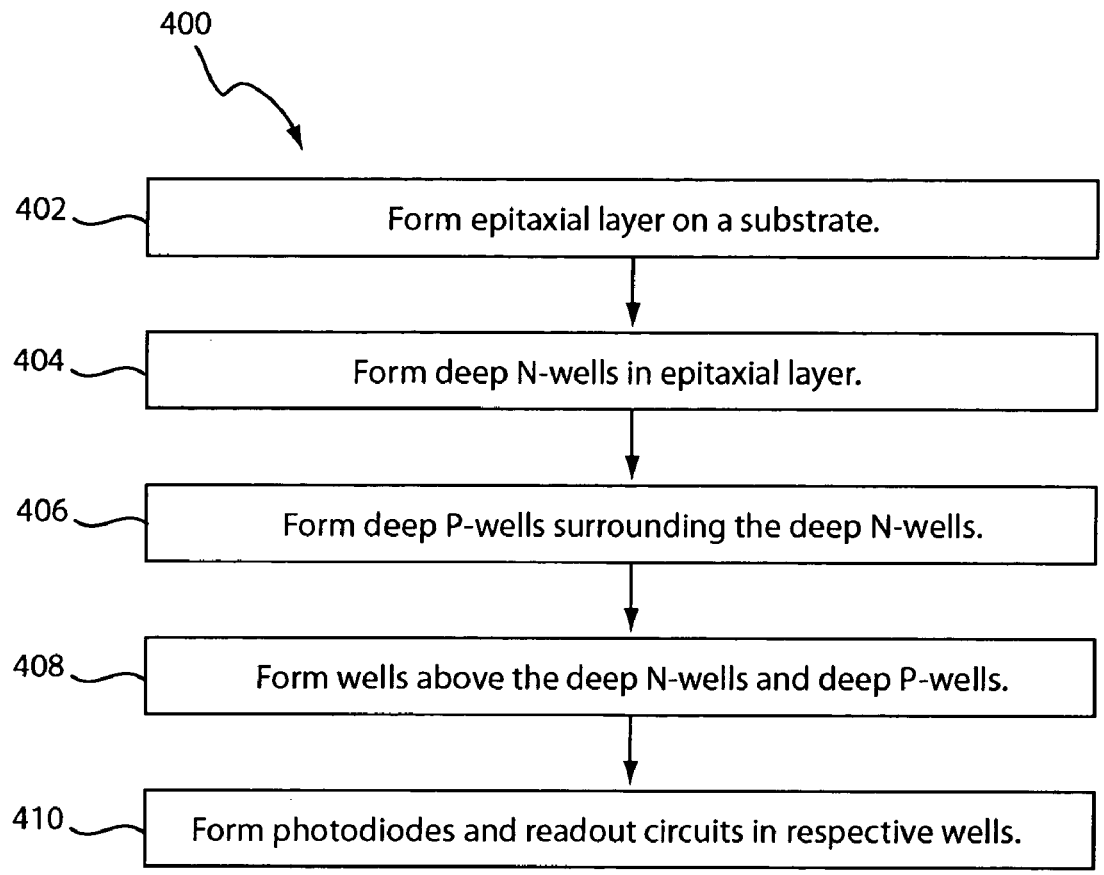
FIG. 4 shows a flow diagram of a method of fabricating a CMOS image sensor for an x-ray imager in accordance with an embodiment of the present invention.

FIG. 4 shows a flow diagram of a method 400 for fabricating a CMOS image sensor for an x-ray imager in accordance with an embodiment of the present invention. Beginning in step 402, an epitaxial layer is formed on a substrate. The substrate may be a p-doped silicon substrate, for example. The epitaxial layer may be lightly doped and grown to a thickness of about 4 to 5 microns, for example. In step 404, deep N-wells may be formed in the epitaxial layer. A deep N-well forms a diode with the epitaxial layer to drain away parasitic electrons generated by directly converted x-rays. The deep N-wells may be formed such that their depletion regions touch the substrate. Optionally, in step 406, deep P-wells are formed such that they laterally surround a deep N-well. This advantageously prevents lateral cross talk. Deep P-wells may also be replaced with deep trenches filled with isolation material. The deep P-wells or deep trenches are optional and may be omitted in applications where lateral cross talk is not a problem. In step 408, wells (e.g., N-well, P-well) are formed above the deep N-wells and optional deep P-wells. The deep N-wells and optional deep P-wells extend below the wells. In step 410, photodiodes and readout circuits are formed in their respective wells above the deep N-wells. For example, a readout circuit may be formed in a P-well directly over a deep N-well, while a photodiode may be formed in an N-well.

Figure 5:
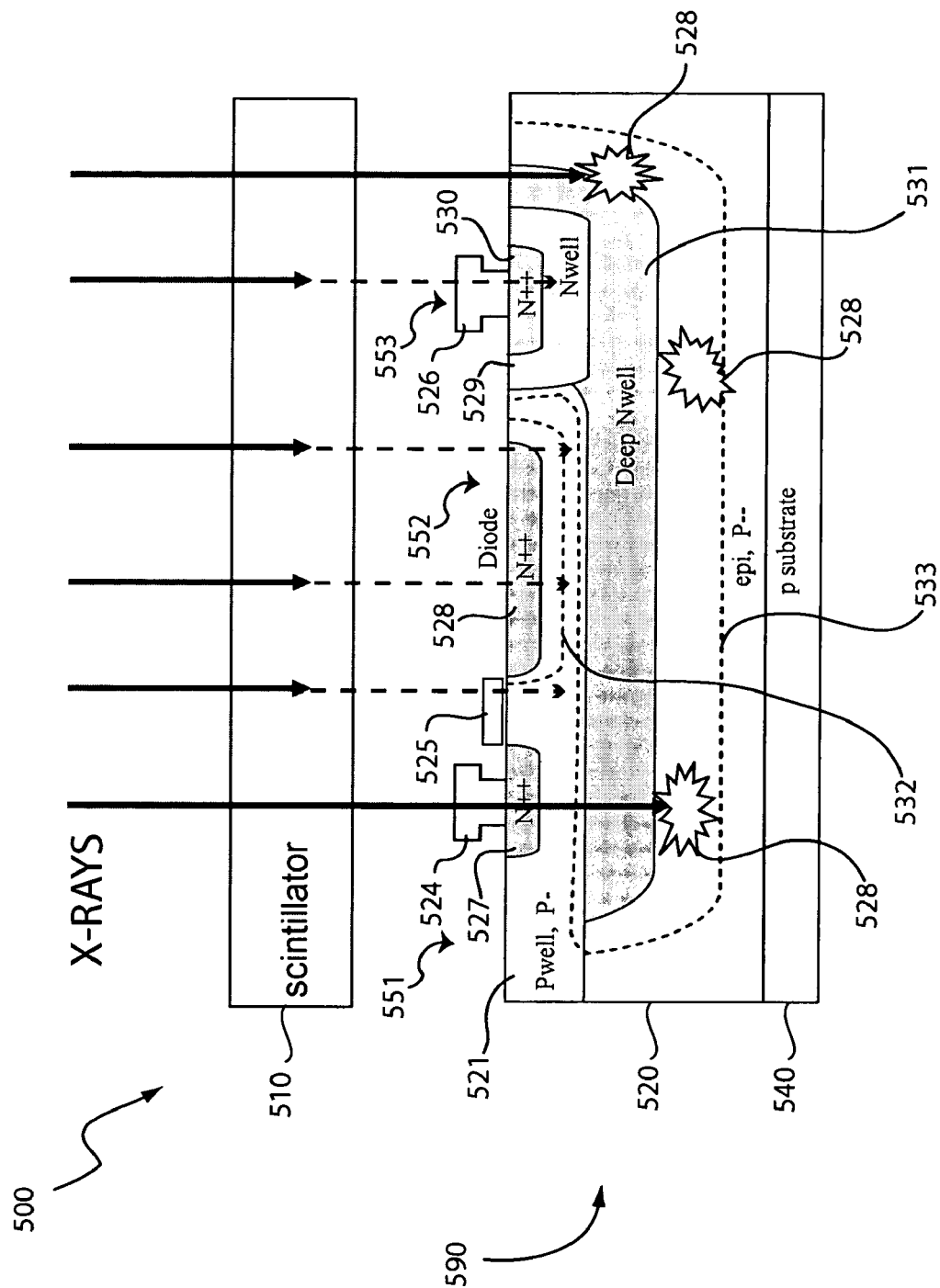
FIG. 5 schematically shows an x-ray imager in accordance with another embodiment of the present invention.

Referring now to FIG. 5, there is schematically shown an x-ray imager 500 in accordance with another embodiment of the present invention. In the example of FIG. 5, x-ray imager 500 comprises a scintillator 510 and a CMOS image sensor 590. The scintillator 510 converts x-rays to visible light. In one embodiment, the scintillator 510 converts x-rays to visible light having a wavelength that is between about 400 to 550 nanometers, with 550 nanometers being more commonly used. In FIG. 5, x-rays are depicted as solid arrow lines and visible light is depicted as dashed arrow lines.

The CMOS image sensor 590 may comprise a substrate 540 and an epitaxial layer 520. Metal shields between the scintillator 510 and image sensor 590 are not shown in the interest of clarity. The metal shields are employed not only to block visible light from readout circuits but also to connect pixels to peripheral electronics such as VDD, output, select, and reset, for example. The metal shields may be laid out centered between photodiodes. Image sensor 590 may comprise readout circuits 551, photodiodes 552, and a parasitic readout circuit 553. Only one readout circuit 551 and one photodiode 552 are shown in FIG. 5 for clarity of illustration. Each photodiode 552 and corresponding readout circuit 551 form a pixel of the image sensor 590. Several pixels may be employed to form an entire image.

In one embodiment, the substrate 540 comprises a p-type silicon substrate. The epitaxial layer 520 may be lightly doped (P— in this example) and epitaxially grown on top of the substrate 540. In one embodiment, the epitaxial layer 520 is about 4 to 5 microns thick. A photodiode 552 comprising an N++ region 528 may be formed in a P-well 521 along with a readout circuit 551 comprising an N++ region 527. In the example of FIG. 5, the electron collection region of a photodiode 552 is generally bounded by a dashed boundary line 532. A photodiode 552 converts visible light hitting the transparent regions of epitaxial layer 520 silicon to electrons. Because of the relatively shallow electron collection region of a photodiode 552, light detection may be limited to light having short wavelengths (e.g., between about 400 to 550 nanometers).

A gate 525 may be enabled by application of voltage thereto to form a channel between N++ regions 527 and 528. This results in electrons generated in a photodiode 552 to flow to the readout circuit 551. A metal contact 524 is coupled to an N++ region of a readout circuit 551 to allow electrons from a corresponding photodiode 552 to be read out to another circuit for further processing.

To minimize the effects of parasitic electrons from directly converted x-rays, a deep N-well 531 may be formed underneath readout circuits 551, photodiodes 552, and the parasitic readout circuit 553. In one embodiment, the deep N-well 531 is common to all pixels of the image sensor 590. That is, a single deep N-well 531 may be underneath all of the readout circuits 551 and photodiodes 552. A single parasitic readout circuit 553 may also be used for all of the pixels. In the example of FIG. 5, the electron collection region of the deep N-well 531 is generally bounded by a dashed boundary line 533.

As shown in FIG. 5, the deep N-well 531 extends below a P-well 521 and the N-well 529. In one embodiment, a P-well 521 and the N-well 529 are formed to a depth of about 1 micron from the top of the epitaxial layer 520, while the deep N-well 531 is formed to about 2 to 3 microns deep from the top of the epitaxial layer 520. The parasitic readout circuit 553 comprising an N++ region 530 may be formed in the N-well 529. As will be more apparent below, a metal contact 526 is coupled to the N++ region 530 to allow parasitic electrons to be drained away from the image sensor 590.

The deep N-well 531, the N-well 529, and the N++ region 530 of the parasitic signal readout circuit 553 form a diode with the p-type epitaxial layer 520. When this diode is forward biased by way of the substrate 540, parasitic electrons from electron clouds 528 generated by directly converted x-ray may be drained away from the image sensor 590 by way of the metal contact 553. This advantageously reduces the amount of parasitic electrons read out of a readout circuit 551, thereby reducing noise in the image. The parasitic readout circuit 553 allows the directly converted x-rays to be drained to a power supply or measured for dosimetric purposes. For example, a measuring circuit (not shown) may be coupled to the metal contact 553 to measure the amount of parasitic electrons and make adjustments to the x-ray source accordingly.

Figure 6:
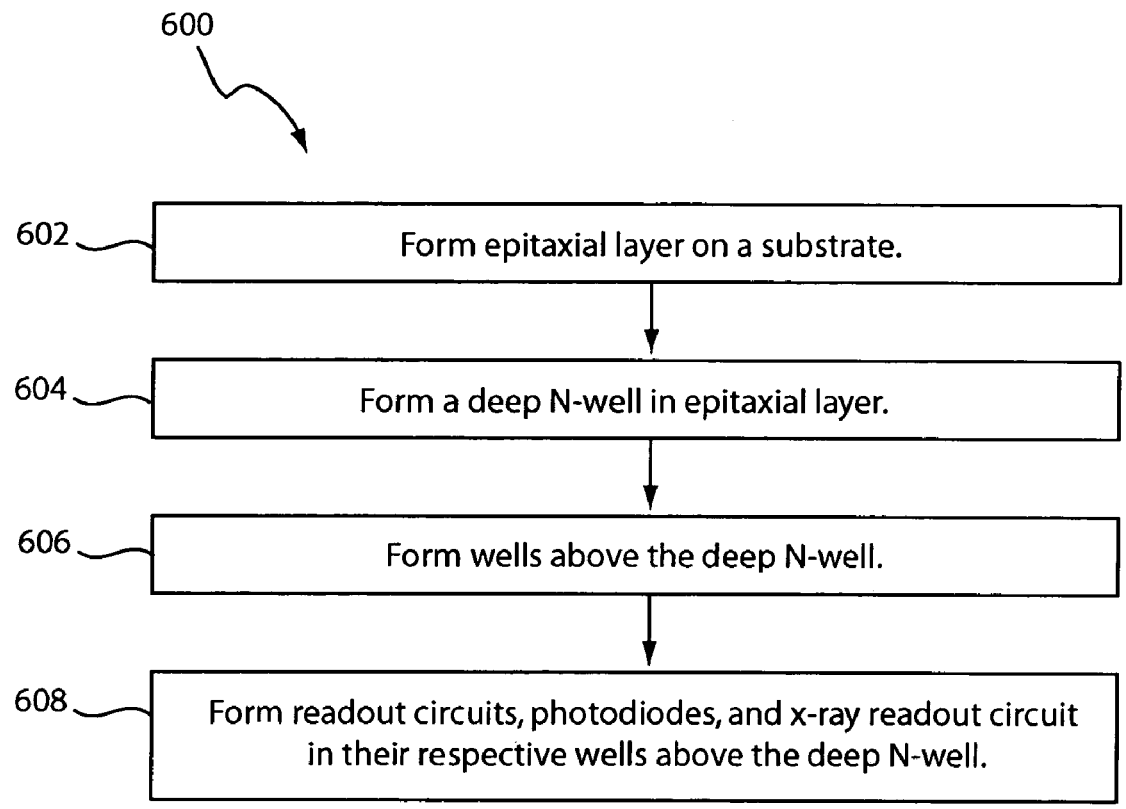
FIG. 6 shows a flow diagram of a method of fabricating a CMOS image sensor for an X-ray imager in accordance with an embodiment of the present invention.

FIG. 6 shows a flow diagram of a method 600 for fabricating a CMOS image sensor for an x-ray imager in accordance with an embodiment of the present invention. Beginning in step 602, an epitaxial layer is formed on a substrate. The substrate may be a p-doped silicon substrate, for example. The epitaxial layer may be lightly doped and grown to a thickness of about 4 to 5 microns, for example. In step 604, a deep N-well may be formed in the epitaxial layer. The deep N-well forms a diode with the epitaxial layer to drain away parasitic electrons generated by directly converted x-rays. In step 606, wells (e.g., N-well, P-well) are formed above the deep N-well. In step 608, photodiodes, readout circuits, and a parasitic readout circuit are formed in their respective wells above the deep N-well. For example, a photodiode and a readout circuit for reading image information from the photodiode may both be formed in a common P-well directly over the deep N-well, while a parasitic readout circuit for draining away parasitic electrons from the image sensor may be formed in an N-well.

Figure 7:
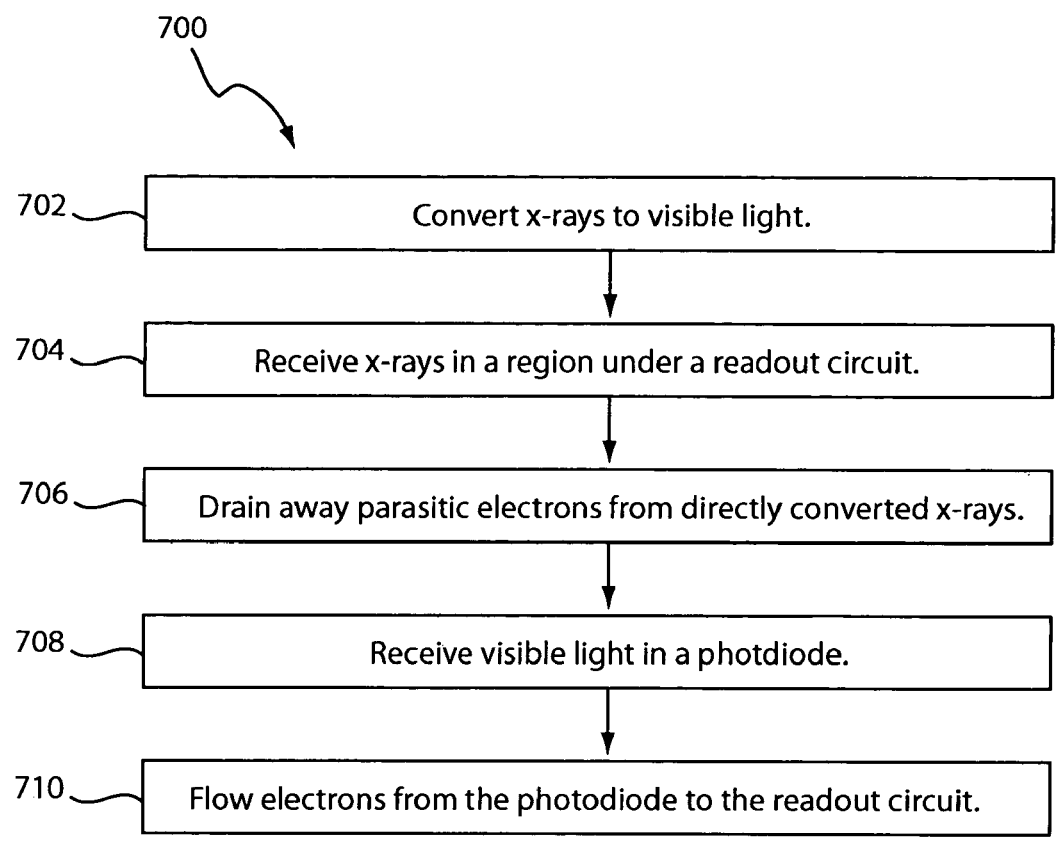
FIG. 7 shows a method of operating an x-ray imager in accordance with an embodiment of the present invention.

Referring now to FIG. 7, there is shown a method 700 of operating an x-ray imager in accordance with an embodiment of the present invention. It is to be noted that while the method 700 is presented in sequential format for illustration purposes, its steps may be rearranged without detracting from the merits of the present invention. For example, the flowing of electrons from a photodiode to a readout circuit may be performed after or at the same time as the draining of parasitic electrons.

In step 702, x-rays are converted to visible light. Step 702 may be performed using a scintillator, for example. In step 704, x-rays are received in a region of a CMOS image sensor under a readout circuit. These x-rays may be those not converted by the scintillator, for example. In step 706, parasitic electrons generated by directly converted x-rays are drained away to minimize their effect on reproduced image. Step 706 may be performed by using a deep N-well that forms a diode with an epitaxial layer, for example. The deep N-well may be forward biased to drain away parasitic electrons to a power supply or a measuring circuit. In step 708, visible light is received in a photodiode of the CMOS image sensor. The photodiode converts the visible light to electrons, which comprise image information. In step 710, electrons from the photodiode are flown out to the readout circuit.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A CMOS image sensor comprising:
   a photodiode in a first well in an epitaxial layer;
   a readout circuit configured to receive image information from the photodiode, the readout circuit being formed in a second well in the epitaxial layer; and
   a first deep well extending below the second well under the readout circuit, the first deep well configured to form a diode to drain way parasitic electrons due to directly converted x-rays.

2. The image sensor of claim 1 wherein the image sensor is part of an x-ray imager that includes a scintillator for converting x-rays to visible light.

3. The image sensor of claim 1 wherein the second well comprises a P-well and the first deep well comprises a deep N-well.

4. The image sensor of claim 1 wherein the first deep well forms the diode with the epitaxial layer.

5. The image sensor of claim 1 wherein the first well comprises an N-well and the second well comprises a P-well.

6. The image sensor of claim 1 further comprising:
a second deep well and a third deep well extending below the second well under the readout circuit, the second deep well and the third deep well surrounding the first deep well such that the width of a depletion area of the first deep well is limited.

7. The image sensor of claim 6 wherein the first deep well is a deep N-well and
the second deep well and the third deep well are deep P-wells.

8. The image sensor of claim 1 further comprising:
a metal shield configured to prevent visible light from hitting portions of the readout circuit.

9. The image sensor of claim 1 wherein the first deep well drains away the parasitic electrons to a power supply.

10. The image sensor of claim 1 wherein the first deep well drains away the parasitic electrons to a measuring circuit to adjust an x-ray source.

11. An image sensor for use in an x-ray imager, the image sensor comprising:
a photodiode configured to receive light from a scintillator;
a readout circuit coupled to the photodiode, the readout circuit being formed in a first well; and
a first deep well extending below the first well under the readout circuit, the first deep well being configured to drain away parasitic electrons.

12. The image sensor of claim 11 further comprising a second deep well extending below the first well and formed on a first side of the first deep well to prevent electrons from laterally moving beyond the second deep well.

13. The image sensor of claim 11 further comprising a third deep well extending below the first well and formed on a second side of the first deep well.

14. The image sensor of claim 11 further comprising a deep trench extending below the first well and formed on a side of the first deep well to prevent electrons from laterally moving beyond the deep trench.

15. The image sensor of claim 11 wherein the photodiode is formed in a second well, the second well is an N-well, the first well is a P-well, and the first deep well is a deep N-well.

* * * * *